United States Patent
Lim et al.

(10) Patent No.: US 10,330,977 B2
(45) Date of Patent: Jun. 25, 2019

(54) DISPLAY DEVICE

(71) Applicant: SAMSUNG DISPLAY CO., LTD., Yongin-si, Gyeonggi-Do (KR)

(72) Inventors: Jaeik Lim, Yongin-si (KR); Haeyun Choi, Yongin-si (KR); Wonsang Park, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 55 days.

(21) Appl. No.: 15/413,880

(22) Filed: Jan. 24, 2017

(65) Prior Publication Data
US 2017/0242300 A1    Aug. 24, 2017

(30) Foreign Application Priority Data
Feb. 23, 2016    (KR) .......................... 10-2016-0021312

(51) Int. Cl.
| | | |
|---|---|---|
| *G02F 1/1335* | (2006.01) | |
| *G02F 1/1334* | (2006.01) | |
| *G02F 1/137* | (2006.01) | |
| *H01L 25/16* | (2006.01) | |

(52) U.S. Cl.
CPC ...... *G02F 1/133603* (2013.01); *G02F 1/1334* (2013.01); *G02F 1/133606* (2013.01); *G02F 1/13718* (2013.01); *G02F 2001/133626* (2013.01); *G02F 2201/44* (2013.01); *H01L 25/167* (2013.01)

(58) Field of Classification Search
CPC ............................................... G02F 1/133603
See application file for complete search history.

(56) References Cited

U.S. PATENT DOCUMENTS

| | | | |
|---|---|---|---|
| 9,064,830 B2 | 6/2015 | Lim et al. | |
| 2007/0268427 A1 | 11/2007 | Uehara | |
| 2014/0159067 A1* | 6/2014 | Sakariya | H01L 24/24 257/88 |
| 2014/0203451 A1* | 7/2014 | Kwon | H01L 23/481 257/774 |
| 2015/0014650 A1* | 1/2015 | Lim | H01L 27/3262 257/40 |
| 2015/0293614 A1* | 10/2015 | Kwak | G02F 1/0131 349/12 |
| 2016/0195754 A1* | 7/2016 | Zhong | G02F 1/13475 349/43 |

FOREIGN PATENT DOCUMENTS

| | | |
|---|---|---|
| KR | 10-2011-0133928 | 12/2011 |
| KR | 10-2015-0006726 | 1/2015 |

* cited by examiner

*Primary Examiner* — Edmond C Lau
(74) *Attorney, Agent, or Firm* — F. Chau & Associates, LLC

(57) ABSTRACT

A display device includes a substrate and a thin-film transistor (TFT) array layer located on the substrate and including a first transistor and a second transistor. The display device further includes a first electrode and a second electrode located on the thin-film transistor array layer. The first electrode is connected to an output electrode of the first transistor and the second electrode is connected to an output electrode of the second transistor. The display device additionally includes a light-emitting diode (LED) located on the first electrode. The display device further includes a capping layer covering the LED and including liquid-crystal molecules and a polymer material. The display device additionally includes a transparent electrode located on the capping layer.

19 Claims, 6 Drawing Sheets

DISPLAY DEVICE

CROSS-REFERENCE TO RELATED APPLICATION

This application claims priority under 35 U.S.C. § 119 to Korean Patent Application No. 10-2016-0021312 filed on Feb. 23, 2016 in the Korean Intellectual Property Office, the disclosure of which is incorporated by reference herein in its entirety.

TECHNICAL FIELD

One or more exemplary embodiments of the present inventive concept relate to a display device, and more particularly, to a display device using a light-emitting diode (LED).

DISCUSSION OF THE RELATED ART

A light-emitting diode (LED) is a semiconductor device which functions by applying a forward voltage to a P-N junction diode, and holes and electrons are then injected and energy is produced in the form of photons when the holes and the electrons recombine.

An inorganic LED that emits light by using an inorganic compound is widely used in a backlight unit of a liquid crystal display (LCD) television (TV), an illumination system, or an electric board. An organic LED that emits light by using an organic compound is used in large televisions as well as in small electronic devices such as mobile phones.

SUMMARY

One or more embodiments of the present inventive concept include a display device having improved light emission efficiency and improved visibility.

According to an exemplary embodiment of the present inventive concept, a display device includes a substrate and a thin-film transistor (TFT) array layer located on the substrate and including a first transistor and a second transistor. The display device further includes a first electrode and a second electrode located on the thin-film transistor array layer. The first electrode is connected to an output electrode of the first transistor and the second electrode is connected to an output electrode of the second transistor. The display device additionally includes a light-emitting diode (LED) located on the first electrode. The display device further includes a capping layer covering the LED and including liquid-crystal molecules and a polymer material. The display device additionally includes a transparent electrode located on the capping layer.

In an exemplary embodiment of the present inventive concept, the capping layer includes a liquid crystal capsule, the liquid crystal capsule including a polymer shell and the liquid-crystal molecules are located in the polymer shell.

In an exemplary embodiment of the present inventive concept, the capping layer includes a polymer dispersed liquid crystal.

In an exemplary embodiment of the present inventive concept, the capping layer is controlled in a transparent mode or a scattering mode according to a voltage applied between the transparent electrode and the second electrode.

In an exemplary embodiment of the present inventive concept, the second electrode surrounds the first electrode.

In an exemplary embodiment of the present inventive concept, the LED is a flip type LED.

In an exemplary embodiment of the present inventive concept, a third electrode is further disposed on the thin-film transistor array layer and the LED is electrically connected to the third electrode.

In an exemplary embodiment of the present inventive concept, the LED is a vertical type LED.

In an exemplary embodiment of the present inventive concept, the LED is in electrical contact with the transparent electrode.

In an exemplary embodiment of the present inventive concept, the capping layer has a curved shape.

In an exemplary embodiment of the present inventive concept, the capping layer further includes a color development member that provides color to an external light being reflected by the display device.

In an exemplary embodiment of the present inventive concept, a color of the color development member is a color in an emission color range of the LED.

In an exemplary embodiment of the present inventive concept, a color of the color development member is a color having a wavelength longer than an emission wavelength of the LED.

In an exemplary embodiment of the present inventive concept, the liquid-crystal molecules included in the capping layer are molecules of a cholesteric liquid crystal.

In an exemplary embodiment of the present inventive concept, a helical pitch of the cholesteric liquid crystal is determined to selectively reflect light having a wavelength band corresponding to an emission color of the LED.

In an exemplary embodiment of the present inventive concept, the second electrode is a transparent electrode. The display device further includes a light-absorbing layer located under the second electrode.

In an exemplary embodiment of the present inventive concept, the capping layer further includes a dichroic dye.

In an exemplary embodiment of the present inventive concept, a color of the dichroic dye is a color in an emission color range of the LED.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF EXEMPLARY EMBODIMENTS

Figure 1:
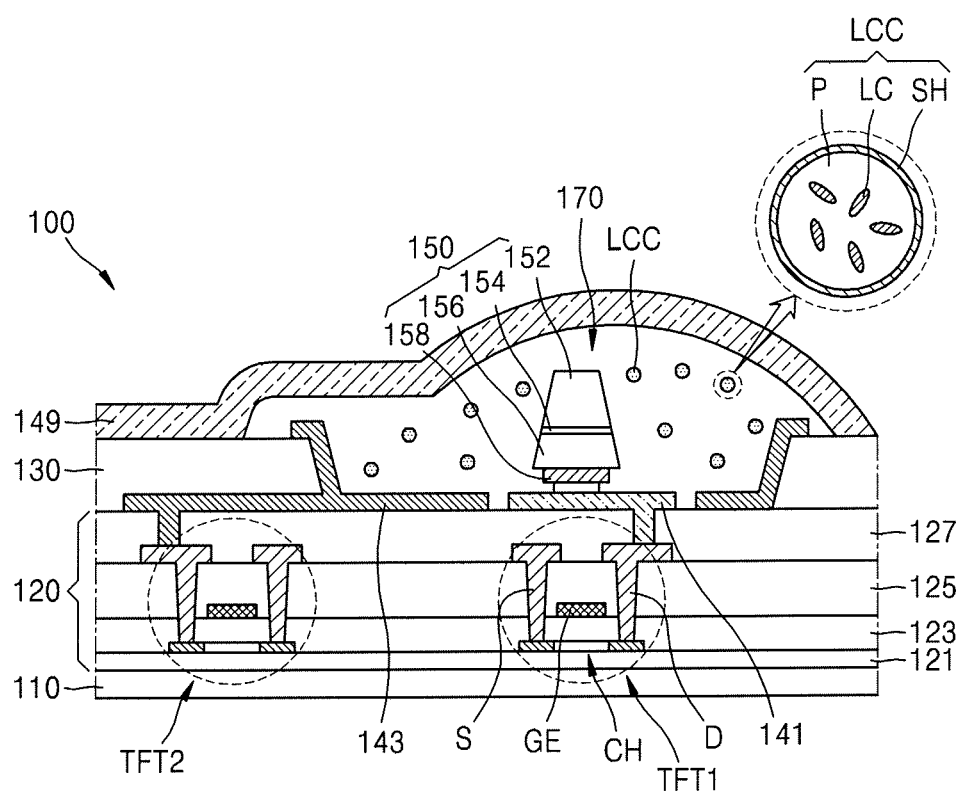
FIG. 1 is a cross-sectional view of a display device according to an embodiment of the present inventive concept.

Exemplary embodiments of the present inventive concept will be described more fully hereinafter with reference to the accompanying drawings.

Elements that are similar or may be assumed to be similar are denoted by like reference numerals and thus a repeated explanation thereof will not be given.

As used herein, the singular forms "a", "an", and "the" are intended to include the plural forms as well, unless the context clearly indicates otherwise.

The drawings and description are to be regarded as illustrative in nature and not restrictive. In the drawings, sizes of elements may be exaggerated for clarity. In other words, since sizes and thicknesses of elements in the drawings may be exaggerated for better understanding and ease of description, the following exemplary embodiments of the present inventive concept are not limited thereto.

Figure 2:
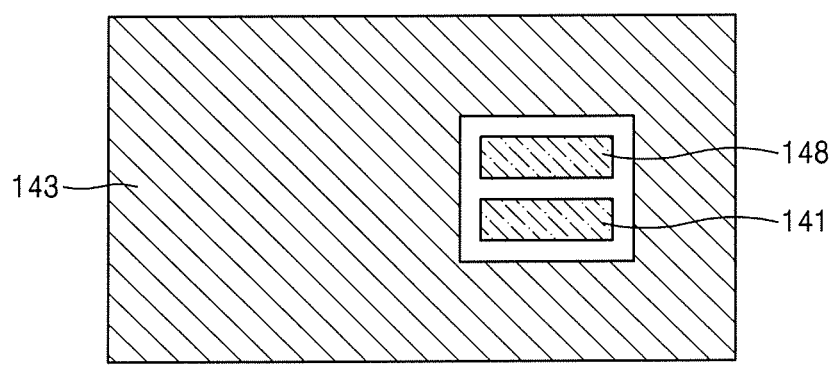
FIG. 2 is a plan view illustrating an arrangement of a first electrode, a second electrode, and a third electrode of the display device of FIG. 1.

FIG. 1 is a cross-sectional view of a display device 100 according to an exemplary embodiment of the present inventive concept. FIG. 2 is a plan view illustrating an arrangement of a first electrode 141, a second electrode 143, and a third electrode 148 of the display device 100 of FIG. 1.

Referring to FIG. 1, the display device 100 may include a display substrate, a light-emitting diode (LED) 150 located on the display substrate, and a capping layer 170 configured to cover the LED 150 and including liquid-crystal molecules. For example, the capping layer 170 may overlap the LED 150. The display substrate may include a substrate 110 and a thin-film transistor (TFT) array layer 120. The TFT array layer 120 may include a first transistor TFT1 that controls the LED 150, and a second transistor TFT2 that controls the liquid-crystal molecules included in the capping layer 170. The first electrode 141 and the second electrode 143 may be respectively connected to output electrodes of the first transistor TFT1 and the second transistor TFT2, and may be disposed on the TFT array layer 120. Also, a transparent electrode 149 may be disposed on the capping layer 170. The transparent electrode 149 and the second electrode 143 may be used for forming an electric field in the capping layer 170.

Each element of the display device 100 will now be explained.

The substrate 100 may include various materials. For example, the substrate 110 may be formed of a transparent glass material having, for example, silicon oxide ($SiO_2$) as a main component, or a transparent plastic material. The substrate 110 may be formed of, for example, a transparent plastic material that is flexible. The plastic material may be an insulating organic material selected from the group including, for example, polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

When the display device 100 is a bottom emission display device (in which an image is formed toward the substrate 110), the substrate 110 has to be formed of a transparent material. However, when the display device 100 is a top emission display device in which an image is formed away from the substrate 110, the substrate 110 might not have to be formed of a transparent material. For example, the substrate 110 may be formed of a metal. When the substrate 110 is formed of a metal, the substrate 110 may include at least one selected from the group including, but not limited to, iron, chromium, manganese, nickel, titanium, molybdenum, stainless steel (SUS), an invar alloy, an Inconel alloy, and a Kovar alloy.

The TFT array layer 120 may be disposed on the substrate 110. To form the first and second transistors TFT1 and TFT2 included in the TFT array layer 120, a buffer layer 121 may be formed on the substrate 110. The buffer layer 121 may planarize a top surface of the substrate 110 and may prevent foreign materials, impurities or moisture from penetrating through the substrate 110. For example, the buffer layer 121 may include an inorganic material such as silicon oxide, silicon nitride, silicon oxynitride, aluminum oxide, aluminum nitride, titanium oxide, or titanium nitride or an inorganic material such as polyimide, polyester, or acryl, and the buffer layer 121 may be formed of a stack of the materials.

The first transistor TFT1 may include a channel layer CH, a gate electrode GE, a source electrode S, and a drain electrode D. Further, the first transistor TFT1 may be a top gate transistor in which the gate electrode GE is formed over the channel layer CH. However, exemplary embodiments of the present inventive concept are not limited thereto. For example, the first transistor TFT1 may be a bottom gate transistor.

The channel layer CH may include a semiconductor material, for example, but not limited to, amorphous silicon or polycrystalline silicon. The channel layer CH may include, for example, an organic semiconductor material. In addition, the channel layer CH may include an oxide semiconductor material. For example, the channel layer CH may include an oxide of a material selected from group 12, 13, and 14 metal elements of the period table of elements such as zinc (Zn), indium (In), gallium (Ga), tin (Sn), cadmium (Cd), or germanium (Ge) and/or a combination thereof.

A gate insulating film 123 may be disposed on the channel layer CH. The gate insulating film 123 may insulate the channel layer CH from the gate electrode GE. The gate insulating film 123 may be a single-layer structure or a multi-layer structure formed of an inorganic material such as silicon oxide and/or silicon nitride.

The gate electrode GE may be disposed on the gate insulating film 123. The gate electrode GE may be connected to a gate line for applying an on/off signal to the first transistor TFT1.

The gate electrode GE may be formed of a metal material having low resistance. The gate electrode GE may be formed as a single-layer structure or a multi-layer structure by including at least one material of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), in consideration of adhesion to an adjacent layer, a flatness of a surface of a stacked layer, and processability.

An interlayer insulating film 125 may be disposed on the gate electrode GE. The interlayer insulating film 125 may insulate the source electrode S and the drain electrode D from the gate electrode GE. The interlayer insulating film 125 may be formed as a single-layer structure or a multi-layer structure by including an inorganic material. For example, the inorganic material may be a metal oxide or a metal nitride. For example, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zirconium oxide ($ZrO_2$).

The source electrode S and the drain electrode D may be disposed on the interlayer insulating film 125. Each of the source electrode S and the drain electrode D may be formed as a single-layer structure or a multi-layer structure by including at least one material selected from among Al, Pt, Pd, Ag, Mg, Au, Ni, Nd, Ir, Cr, Li, Ca, Mo, Ti, W, and Cu. The source electrode S and the drain electrode D are formed to contact the channel layer CH. In addition, the drain electrode D may be in contact with the first electrode 141.

The second transistor TFT2 may have a structure and function similar to that of the first transistor TFT1.

A planarization layer 127 may be disposed on the first and second transistors TFT1 and TFT2. The planarization layer 127 may be disposed on the first and second transistors TFT1 and TFT2 such that it covers the first and second transistors TFT1 and TFT2, and prevents a stepped portion from being formed by the first and second transistors TFT1 and TFT2. The planarization layer 127 may planarize top surfaces of the first and second transistors TFT1 and TFT2. The planarization layer 127 may be formed as a single-layer structure or a multi-layer structure by including an organic material. The organic material may include, for example, a general-purpose polymer (such as polymethylmethacrylate (PMMA) or polystyrene (PS)), a polymer derivative including a phenol group, an acrylic polymer, an imide-based polymer, an arylether-based polymer, an amide-based polymer, a fluorine-based polymer, a p-xylene-based polymer, a vinyl alcohol-based polymer, and a blend thereof. Also, the planarization layer 127 may be formed of a stack of an inorganic insulating layer and an organic insulating layer.

A pixel-defining film 130, the first electrode 141, the second electrode 143, and the third electrode 148 may be disposed on the planarization layer 127. The pixel-defining film 130 may be formed of an insulating material and is patterned to have an opening to define a pixel position. The first electrode 141, the second electrode 143, and the third electrode 148 may be disposed at the pixel position defined by patterning the pixel-defining film 130. For example, the second electrode 143 may be partially disposed in the opening of the pixel-defining film 130, and the first electrode 141 and the third electrode 148 may be disposed in the opening of the pixel-defining film 130. The third electrode 148 is shown only in the plan view of FIG. 2 and is not shown in FIG. 1.

Referring to FIG. 2, the first electrode 141 and the third electrode 148 may each have a size large enough to apply a voltage to the LED 150. The second electrode 143 may be formed to have a relatively large size to form an electric field in the entire capping layer 170 along with the transparent electrode 149. For example, the second electrode 143 may cover a majority of the planarization layer 127. Further, the second electrode 143 may surround the first electrode 141 and the third electrode 148. However, exemplary embodiments of the present inventive concept are not limited thereto.

The first electrode 141 is electrically connected to the first transistor TFT1 by passing through the planarization layer 127, and the second electrode 143 is electrically connected to the second transistor TFT2 by passing through the planarization layer 127.

The LED 150 may be disposed on the first electrode 141. A first electrode pad 158 of the LED 150 is connected to the first electrode 141, for example, by using a bonding layer. A second electrode pad of the LED 150 is electrically connected to the third electrode 148.

The LED 150 may emit red, green, or blue light, and may emit white light by using a fluorescent material or combining colors. The LED 150 may include a first semiconductor layer 156, a second semiconductor layer 152, and an active layer 154 disposed between the first semiconductor layer 156 and the second semiconductor layer 152.

The first semiconductor layer 156 may be, for example, a p-type semiconductor layer. The first semiconductor layer 156 may be formed of a material selected from among, for example, semiconductor materials having a composition formula of $In_xAl_yGa_{1-x-y}N$ (where $0 \leq x \leq 1$, $0 \leq y \leq 1$, and $0 \leq x+y \leq 1$), for example, gallium nitride (GaN), aluminum nitride (AlN), aluminum gallium nitride (AlGaN), indium gallium nitride (InGaN), indium nitride (InN), indium aluminum (InAlGaN), and aluminum indium nitride (AlInN), and may be doped with a p-type dopant such as Mg, Zn, Ca, strontium (Sr), or barium (Ba).

The second semiconductor layer 152 may be, for example, an n-type semiconductor layer. The second semiconductor layer 152 may be formed of a material selected from among, for example, semiconductor materials having a composition formula of $In_xAl_yGa_{1-x-y}N$ (where $0 \leq x \leq 0 \leq 1$, $0 \leq y \leq 1$, and $0 \leq x+y \leq 1$), for example, GaN, AlN, AlGaN, InGaN, InN, InAlGaN, and AlInN, and may be doped with an n-type dopant such as silicon (Si), Ge, or tin (Sn).

Doping types of the first semiconductor layer 156 and the second semiconductor layer 152 are merely examples, and exemplary embodiments of the present inventive concept are not limited thereto. For example, the first semiconductor layer 156 may be an n-type semiconductor layer, and the second semiconductor layer 152 may be a p-type semiconductor layer.

The active layer 154 is where electrons and holes recombine with each other. When the electrons and holes are recombing with each other, the electrons may shift to a lower energy level and energy may be released in the form of photons. The photons may provide light having a wavelength corresponding to the lower energy level. The active layer 154 may be formed of a semiconductor material having a composition formula of $In_xAl_yGa_{1-x-y}N$ (where $0 \leq x \leq 1$, $0 \leq y \leq 1$, and $0 \leq x+y \leq 1$) and may be formed to have a single quantum well structure or a multi-quantum well (MQW) structure. Also, the active layer 154 may include a quantum wire structure or a quantum dot structure.

The LED 150 may be a flip type LED in which two electrode pads for injecting electrons and holes are arranged in parallel to the active layer 154. That is, the first semiconductor layer 156 may be disposed between the active layer 154 and the first electrode pad 158, and the second electrode pad may be disposed on substantially a same plane on which the first electrode pad 158 is disposed, which is electrically connected to the second semiconductor layer 152. The first electrode pad 158 may be connected to the first electrode 141, and the second electrode pad may be electrically connected to the third electrode 148.

Each of the first electrode 141, the second electrode 143, and the third electrode 148 may be a transparent electrode or a reflective electrode. The reflective electrode may include a reflective film formed of one of, for example, Ag, Mg, Al, Pt, Pd, Au, Ni, Nd, Ir, and Cr or at least one compound thereof. Further, the reflective electrode may include a transparent or semi-transparent electrode disposed on the reflective film.

The transparent or semi-transparent electrode layer may include at least one conductive oxide, such as indium tin oxide (ITO), indium zinc oxide (IZO), a zinc oxide (ZnO), indium oxide ($In_2O_3$), indium gallium oxide (IGO), and aluminum zinc oxide (AZO).

The capping layer 170 may be formed to cover the LED 150. Further, the capping layer 170 may have a curved shape. However, exemplary embodiments of the present inventive concept are not limited thereto. For example, the capping layer 170 may have a substantially flat shape. The capping layer 170 caps (e.g., covers) and protects the LED 150. For example, the capping layer 170 may protect the LED 150 from impurities. In an exemplary embodiment of the present inventive concept, to increase a diffusion angle of light emitted from the LED 150, the capping layer 170 includes liquid-crystal molecules LC and a polymer material P. The capping layer 170 may include, for example, a liquid crystal capsule LCC. The liquid crystal capsule LCC that capsules the liquid-crystal molecules LC may include a polymer shell SH, and the liquid-crystal molecules LC may be located in the polymer shell SH. The inside of the liquid crystal capsule LCC may be filled with the polymer material P. A diameter of the liquid crystal capsule LCC may be greater than a length of a long axis of a liquid-crystal molecule LC. The diameter of the liquid crystal capsule LCC may be large enough to freely change an arrangement direction of the liquid-crystal molecules LC in the liquid crystal capsule LCC according to an applied electric field. A refractive index difference between the polymer material P and the liquid-crystal molecules LC may be adjusted according to the arrangement direction of the liquid-crystal molecules LC.

The capping layer 170 may include a polymer-dispersed liquid crystal (PDLC). The PDLC may include liquid-crystal molecules that are dispersed in a polymer matrix, and a refractive index difference between liquid-crystal molecules and a polymer may be adjusted according to an arrangement of the liquid-crystal molecules being affected by an electric field. Although the capping layer 170 includes the liquid crystal capsule LCC, exemplary embodiments of the present inventive concept are not limited thereto. For example, the capping layer 170 may have any structure among various other structures in which liquid-crystal molecules and a polymer may be included in.

The transparent electrode 149 is disposed on the capping layer 170. The transparent electrode 149 may include at least one conductive oxide, such as ITO, IZO, ZnO, $In_2O_3$, IGO, and AZO.

A voltage may be applied between the transparent electrode 149 and the second electrode 143, and thus an electric field may be formed in the capping layer 170. The transparent electrode 149 may also be electrically connected to the third electrode 148 and may act as a reference electrode for applying a voltage between the first electrode 141 and the third electrode 148. For example, the transparent electrode 149 may be a common electrode for the second electrode 143 and the first electrode 141.

Figure 3A:
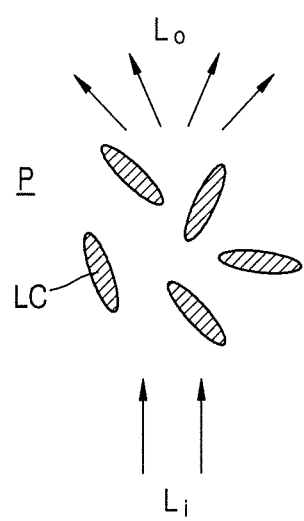
FIGS. 3A and 3B are conceptual views for explaining a scattering mode and a transparent mode that are formed due to an activity of a polymer and an arrangement of liquid-crystal molecules included in a capping layer of the display device of FIG. 1.
Figure 3B:
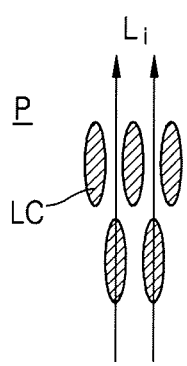

FIGS. 3A and 3B are conceptual views for explaining a scattering mode and a transparent mode that are formed according to an activity of the polymer material P and an arrangement of the liquid-crystal molecules LC included in the capping layer 170 of the display device 100 of FIG. 1.

The liquid-crystal molecules LC have dielectric anisotropy. That is, refractive indices of the long axis of the liquid-crystal molecules LC and a short-axis of the liquid-crystal molecules LC are different from each other. Accordingly, a refractive index may be adjusted by adjusting an arrangement of the liquid-crystal molecules LC.

In FIG. 3A, when no voltage is applied between the transparent electrode 149 and the second electrode 143 and, thus, no electric field is formed in the capping layer 170, the liquid-crystal molecules LC may be randomly arranged. Accordingly, the randomly arranged liquid crystal molecule LC may have different refractive indices. In this case, the liquid-crystal molecules LC and a material around the liquid-crystal molecules LC, for example, the polymer material P, have refractive indices that are different from each other. Further, refractive index boundary surfaces may be randomly formed because of the different refractive indices between the liquid-crystal molecules LC and the material around the liquid-crystal molecules LC. Since refractive index boundary surfaces are randomly formed, incident light $L_i$ may be refracted and emitted in various directions. That is, emitted light $L_o$ has a diffusion angle that is greater than that of the incident angle $L_i$.

In FIG. 3B, the liquid-crystal molecules LC are arranged in one direction. That is, an electric field is formed due to a voltage applied between the transparent electrode 149 and the second electrode 143, and the liquid-crystal molecules LC may be arranged in a direction substantially parallel to the electric field, or a direction substantially perpendicular to the electric field. When the liquid-crystal molecules LC have positive anisotropy, the liquid-crystal molecules LC are arranged in a direction substantially parallel to the electric field. When the liquid-crystal molecules LC have negative anisotropy, the liquid-crystal molecules LC are arranged in a direction substantially perpendicular to the electric field. A refractive index of the liquid-crystal molecules LC arranged in one direction due to an applied electric field may be the same as that of the polymer material P around the liquid-crystal molecules LC, and in this case, refractive index boundary surfaces are not formed. Accordingly, the incident light $L_i$ is emitted without being refracted, that is, a transparent mode is formed.

As such, a transparent mode or a scattering mode may be formed by adjusting an arrangement of the liquid-crystal molecules LC by using an applied voltage. Also, in a scattering mode, a degree of scattering may be adjusted by adjusting a refractive index difference between the liquid-crystal molecules LC and the polymer material P. Accordingly, a diffusion angle of light emitted from the LED 150 may be adjusted by adjusting a degree of arrangement of the liquid-crystal molecules LC by adjusting a voltage applied between the transparent electrode 149 and the second electrode 143.

When a diffusion angle increases, a color shift may decrease. A color shift is when a difference between a color viewed from a front surface and a color viewed from a side surface increases as a viewing angle increases; that is, the viewing angle moves from substantially facing the front surface to substantially facing the side surface. As a diffusion angle of light emitted in each pixel region decreases, a rate of increase in a color shift according to a viewing angle increases. Accordingly, an increase in a color shift according to a viewing angle may be reduced by increasing a diffusion angle of the light emitted from the LED 150.

Figure 4:
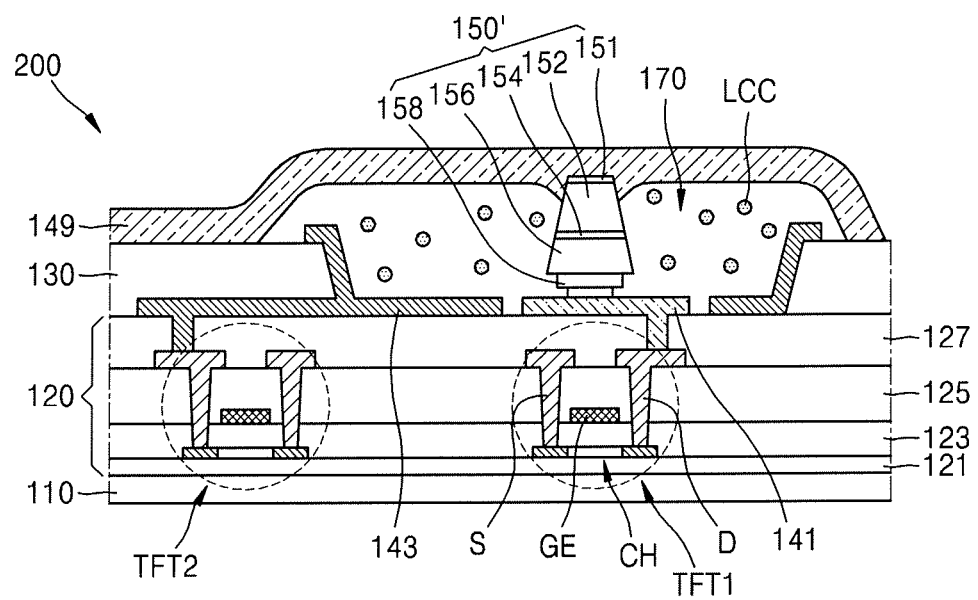
FIG. 4 is a cross-sectional view of a display device according to an exemplary embodiment of the present inventive concept.
Figure 5:
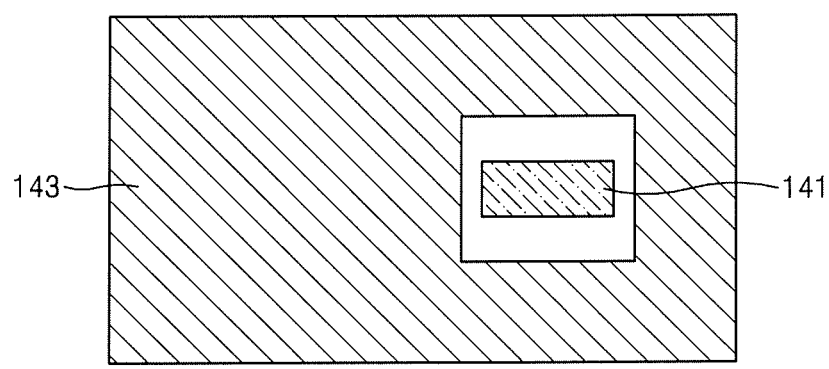
FIG. 5 is a plan view illustrating an arrangement of the first electrode and the second electrode of the display device of FIG. 4.

FIG. 4 is a cross-sectional view of a display device 200 according to an exemplary embodiment of the present inventive concept. FIG. 5 is a plan view illustrating an arrangement of the first electrode 141 and the second electrode 143 of the display device 200 of FIG. 4.

The display device 200, according to an exemplary embodiment of the present inventive concept, is different from the display device 100 of FIG. 1 in that an LED 150' is a vertical type LED.

The first electrode pad 158 and a second electrode pad 151 of the LED 150' might not be disposed on the same surface, and are spaced apart from each other in a vertical direction (e.g., a stack direction). For example, first semiconductor layer 156, the active layer 154, and the second semiconductor layer 152 may be vertically stacked between the first electrode pad 158 and the second electrode pad 151. The second electrode pad 151 may be disposed to be in contact with the transparent electrode 149. The first electrode pad 158 may be disposed to be in contact with the first electrode 141. Since the first electrode pad 158 is electrically connected to the first electrode 141, the first electrode 141 and the second electrode 143 are disposed on the planarization layer 127 and the third electrode 148 of FIG. 2 is not provided. As shown in FIG. 5, the second electrode 143 may surround the first electrode 141. However, exemplary embodiments of the present inventive concept are not limited thereto.

Although the following will be explained on the assumption that the LED 150 is a flip type LED, exemplary embodiments of the present inventive concept are not limited thereto and the LED 150 may be a vertical type LED.

Figure 6:
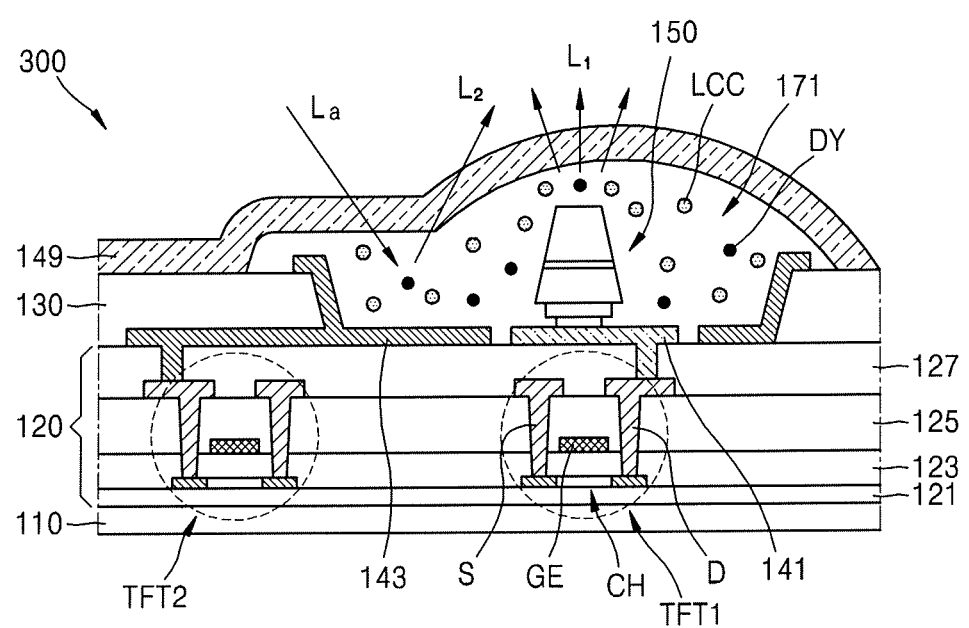
FIG. 6 is a cross-sectional view of a display device according to an exemplary embodiment of the present inventive concept.

FIG. 6 is a cross-sectional view of a display device 300 according to an exemplary embodiment of the present inventive concept.

The display device 300 according to an exemplary embodiment of the present inventive concept is different from the display device 100 of FIG. 1 in that a capping layer 171 further includes a color development member DY in addition to the liquid crystal capsule LCC.

The color development member DY may be, for example, a dye, a pigment, a fluorescent material or quantum dots. A color of the color development member DY may be determined based on an emission color range of the LED 150. For example, when the LED 150 emits red light, a color of the color development member DY may be red. When the LED 150 emits green light or blue light, a color of the color development member DY may be green or blue. Alternatively, a color of the color development member DY may be determined to be a color having a wavelength longer than an emission wavelength of the LED 150. For example, when the LED 150 emits ultraviolet light, a color of the color development member DY may be red, green, or blue.

When the capping layer 171 further includes the color development member DY, light emitted from the LED 150 may be scattered by the liquid crystal capsule LCC and a diffusion angle may be increased. Also, external light $L_a$ incident on the capping layer 171 may be scattered by the liquid crystal capsule LCC and may have a color due to the color development member DY. Further, the color of the external light $L_a$ incident on the capping layer 171 may have a color that corresponds to the emission color range of LED 150 due to the color development member DY. Since the color development member DY transmits a corresponding color, only light having the corresponding color may be emitted to the outside of the display device 300 due to the color development member DY when the incident external light $L_a$ is scattered by the liquid crystal capsule LCC. Even when the capping layer 171 is controlled in a transparent mode, if the second electrode 143 is a reflective electrode, the external light $L_a$ may be reflected by the second electrode 143 to be emitted to the outside of the display device 300, and only light having the corresponding color may be emitted due to the color development member DY. For example, since light $L_2$, which is scattered by the liquid crystal capsule LCC or is reflected and emitted by the second electrode 143 from among the incident external light $L_a$, has the same color as that of the light $L_1$ emitted from the LED 150, color purity and luminance may be improved.

Figure 7:
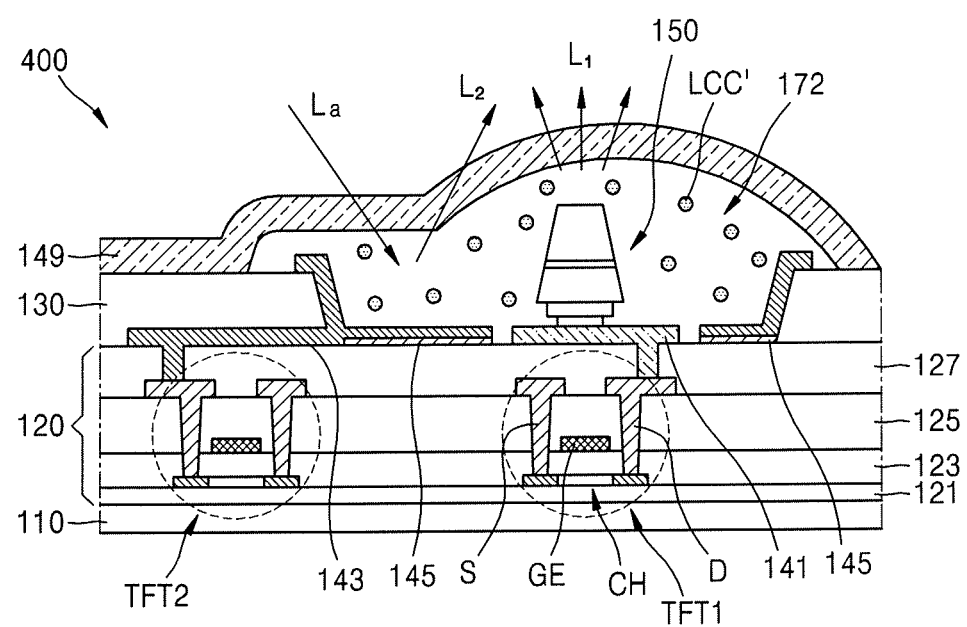
FIG. 7 is a cross-sectional view of a display device according to an exemplary embodiment of the present inventive concept.

FIG. 7 is a cross-sectional view of a display device 400 according to an exemplary embodiment of the present inventive concept.

The display device 400 of an exemplary embodiment of the present inventive concept is different from the display devices 100, 200, and 300 of exemplary embodiments of the present inventive concept in that a liquid crystal capsule LCC' included in a capping layer 172 may include a cholesteric liquid crystal.

The cholesteric liquid crystal has a helical structure in which liquid-crystal molecules are arranged in layers and each layer is rotated. The cholesteric liquid crystal selectively reflects light with a specific circular polarization and a specific wavelength. A reflected wavelength band is determined by a helical pitch of the cholesteric liquid crystal. According to an exemplary embodiment of the present inventive concept, a helical pitch of the cholesteric liquid crystal may be determined to selectively reflect light having a wavelength corresponding to an emission color of the LED 150. The cholesteric liquid crystal may transmit (and not reflect) light with a wavelength other than a selectively reflected wavelength band. As a result, the second electrode 143 may be a transparent electrode, a light-absorbing layer 145 may be disposed on a bottom surface of the second electrode 143, and light having a wavelength other than the selectively reflected wavelength band may be absorbed by the light-absorbing layer 145.

Since a helical direction of the cholesteric liquid crystal is adjusted according to a direction of an electric field, a function of selectively reflecting light having a specific wavelength may be adjusted to be turned on or off according to a voltage applied between the transparent electrode 149 and the second electrode 143. In addition, grayscale expression may be performed. That is, a region of the capping layer 172 may operate as a reflective display pixel at which grayscale expression may be performed by using the external light $L_a$ and by adjusting an electric field formed in the capping layer 172 according to a voltage applied between the transparent electrode 149 and the second electrode 143.

Since the display device 400 may use the external light $L_a$ as well as light emitted from the LED 150 to form an image, visibility, even in a bright outdoor environment, may be improved.

Figure 8:
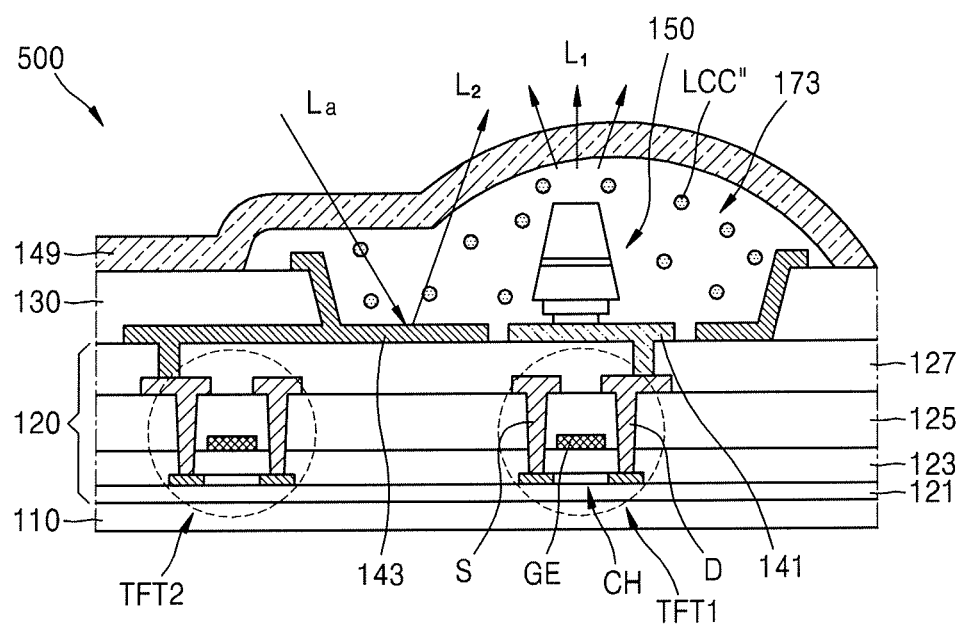
FIG. 8 is a cross-sectional view of a display device according to an exemplary embodiment of the present inventive concept.

FIG. 8 is a cross-sectional view of a display device 500 according to an exemplary embodiment of the present inventive concept.

The display device 500, according to an exemplary embodiment of the present inventive concept, is different from the display devices 100, 200, 300, and 400 of the exemplary embodiments of that present inventive concept in that a liquid crystal capsule LCC" included in a capping layer 173 may further include a dichroic dye. The dichroic dye may be disposed in liquid-crystal molecules of the liquid crystal capsule LCC". The dichroic dye that is an anisotropic dye may produce a specific color by absorbing or transmitting light according to a direction of incident light. The specific color that may be produced by the dichroic dye may be determined based on an emission color range of the LED 150. For example, when the LED 150 emits red light, a color of the dichroic dye may be red. When the LED 150 emits green light or blue light, a color of the dichroic dye may be green or blue.

The dichroic dye is arranged along with the liquid-crystal molecules according to an applied electric field, and thus grayscale expression may be performed by adjusting an intensity of the electric field. When an electric field is not formed in the capping layer 173 and the liquid-crystal molecules of the liquid crystal capsule LCC" are randomly arranged, a color is not produced since the dichroic dye is also randomly arranged along with the liquid-crystal molecules. When an electric field is formed in the capping layer 173 and the liquid-crystal molecules of the liquid crystal capsule LCC" are arranged in one direction, the dichroic dye may be arranged in one direction along with the liquid-crystal molecules and a specific color may be produced. Since a degree of arrangement of the liquid-crystal molecules and the dichroic dye may be adjusted by a voltage applied between the transparent electrode 149 and the second electrode 143, a grayscale expression of the specific color may be accordingly performed.

That is, according to the display device 500 according to an exemplary embodiment of the present inventive concept, like the display device 400 of FIG. 7, a region of the capping layer 173 may operate as a reflective display pixel at which grayscale expression may be performed by using the external light $L_a$ and by adjusting an electric field formed in the capping layer 173. When the incident external light $L_a$ is reflected by the second electrode 143 that is a reflective electrode, a color and a grayscale of the emitted light $L_2$ may be adjusted by adjusting an electric field applied to the capping layer 173. Since a color of the emitted light $L_2$ is the same color as that of the light $L_1$ emitted from the LED 150 and a grayscale of the emitted light $L_2$ may be increased or decreased, color purity and luminance may be adjusted. Also, since the external light $L_a$ as well as the light $L_1$ emitted from the LED 150 may be used to form an image, visibility, even in a bright outdoor environment, may be improved.

Since the display device includes liquid-crystal molecules for adjusting a degree of scattering light in a capping layer of an LED, light emission efficiency may be improved and a diffusion angle of emitted light may be adjusted.

Since the display device may adjust a diffusion angle of emitted light, an increase in a color shift according to an increase in a viewing angle may be reduced.

Since the display device may use a region of the capping layer as a reflective display pixel using external light, visibility in an outdoor environment may be improved.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A display device comprising:
a substrate;
a thin-film transistor (TFT) array layer located on the substrate and comprising a first transistor and a second transistor;
a first electrode and a second electrode located on the thin-film transistor array layer, wherein the first electrode is connected to an output electrode of the first transistor and the second electrode is connected to an output electrode of the second transistor;
a light-emitting diode (LED) located on the first electrode;
a capping layer covering the LED and comprising liquid-crystal molecules and a polymer material; and
a transparent electrode located on the capping layer, wherein the liquid crystal molecules and the polymer material are disposed between the second electrode and the transparent electrode and between the first electrode and the transparent electrode, wherein the liquid crystal molecules and the polymer material are disposed between the second electrode and the transparent electrode in a direction perpendicular to a plane of the substrate and between the first electrode and the transparent electrode in the direction perpendicular to the plane of the substrate.

2. The display device of claim 1, wherein the capping layer comprises a liquid crystal capsule, the liquid crystal capsule comprising a polymer shell and the liquid-crystal molecules are located in the polymer shell.

3. The display device of claim 1, wherein the capping layer comprises a polymer dispersed liquid crystal.

4. The display device of claim 1, wherein the capping layer is controlled in a transparent mode or a scattering mode according to a voltage applied between the transparent electrode and the second electrode.

5. A display device comprising:
a substrate;
a thin-film transistor (TFT) array layer located on the substrate and comprising a first transistor and a second transistor;
a first electrode and a second electrode located on the thin-film transistor array layer, wherein the first electrode is connected to an output electrode of the first transistor and the second electrode is connected to an output electrode of the second transistor;
a light-emitting diode (LED) located on the first electrode;
a capping layer covering the LED and comprising liquid-crystal molecules and a polymer material; and
a transparent electrode located on the capping layer, wherein the second electrode surrounds the first electrode.

6. The display device of claim 1, wherein the LED is a flip type LED.

7. The display device of claim 6, wherein a third electrode is further disposed on the thin-film transistor array layer and the LED is electrically connected to the third electrode.

8. The display device of claim 1, wherein the LED is a vertical type LED.

9. The display device of claim 8, wherein the LED is in electrical contact with the transparent electrode.

10. The display device of claim 1, wherein the capping layer has a curved shape.

11. The display device of claim 1, wherein the capping layer further comprises a color development member that provides color to an external light being reflected by the display device.

12. The display device of claim 11, wherein a color of the color development member is a color in an emission color range of the LED.

13. The display device of claim 11, wherein a color of the color development member is a color having a wavelength longer than an emission wavelength of the LED.

14. The display device of claim 1, wherein the liquid-crystal molecules included in the capping layer are molecules of a cholesteric liquid crystal.

15. The display device of claim 14, wherein a helical pitch of the cholesteric liquid crystal is determined to selectively reflect light having a wavelength band corresponding to an emission color of the LED.

16. The display device of claim 15, wherein the second electrode is a transparent electrode, and
the display device further comprises a light-absorbing layer located under the second electrode.

17. The display device of claim 1, wherein the capping layer further comprises a dichroic dye.

18. The display device of claim 17, wherein a color of the dichroic dye is a color in an emission color range of the LED.

19. The display device of claim 1, wherein the liquid crystal molecules and the polymer material surround the LED.

* * * * *